United States Patent [19]

Lynch

[11] Patent Number: 4,634,960
[45] Date of Patent: Jan. 6, 1987

[54] AUTOMATIC LINEAR COMPRESSION CIRCUIT

[75] Inventor: David L. Lynch, Kanata, Canada

[73] Assignee: Northern Telecom Limited, Montreal, Canada

[21] Appl. No.: 784,491

[22] Filed: Oct. 4, 1985

[30] Foreign Application Priority Data

Feb. 13, 1985 [CA] Canada ................................. 474209

[51] Int. Cl.$^4$ ........................................... G05B 24/02
[52] U.S. Cl. ................................... 323/350; 323/352; 381/104; 379/390
[58] Field of Search ...................... 323/350, 352, 354; 333/81 R; 179/81 B, 81 R, 190; 381/104, 107

[56] References Cited

U.S. PATENT DOCUMENTS

| | | | |
|---|---|---|---|
| 4,161,624 | 7/1979 | Brosow | 179/81 B |
| 4,386,236 | 5/1983 | Ferrieu et al. | 179/81 B |
| 4,580,013 | 4/1986 | Moisin | 179/81 B |

Primary Examiner—Patrick R. Salce
Assistant Examiner—Emanuel Todd Voeltz
Attorney, Agent, or Firm—Charles W. Fallow; Mitchell B. Wasson; Martin P. Hoffman

[57] ABSTRACT

An automatic linear compression circuit for a telephone "handsfree" loudspeaker is provided. The circuit consists of a variable attenuator the level of attenuation of which is controlled by the input signal level. The input signal is passed through a positive peak detector to obtain a time averaged signal corresponding to the average positive peak values of the input signal and this time averaged signal is compared against a time increasing reference voltage. As long as the reference voltage is below the value of the time averaged signal a positive attenuator control signal is derived. This positive control signal keeps the attenuator portion of the circuit operative. In the attenuator the input voltage is sampled to a first capacitor. The first capacitor is subsequently connected to and disconnected from a second capacitor a number of times as long as the positive attenuator control signal is present. Each time this is done the voltage on the first capacitor is reduced by a factor depending on the capacitances of the two capacitors. After a predetermined time the voltage remaining on the first capacitor is passed through buffers and another capacitor to provide an attenuated output. The circuit is simple and flexible, permitting wide ranges in the operating parameters to be achieved simply by including one or more variable capacitors.

15 Claims, 4 Drawing Figures

$$Tr = \frac{R10 \cdot R11}{(R10 + R11)} \cdot C12$$

$$Tf = R11 \cdot C12$$

R14 = R11
R13 = R10

AUTOMATIC LINEAR COMPRESSION CIRCUIT

BACKGROUND OF THE INVENTION

This invention relates to a variable attenuator and in particular to an automatic linear compression circuit the level of attenuation of which is controlled by the input signal level.

In telephone terminals having a so-called "handsfree" capability a well-known problem is that, unless rectifying action is taken, the dial tone reproduced on the telephone terminal loudspeaker is unacceptably loud. This is because, on the one hand, the loudspeaker has to be set high enough to reproduce audibly voice signals and, on the other hand, the time averaged peak level of the dial tone is much higher than the time averaged peak level of the voice signals. Typically an automatic compressor is used to reduce selectively the signal level of the dial tone while leaving the voice level unattenuated. One drawback of prior systems is that without an increased number of components they cannot provide an acceptable range of attenuation.

Accordingly it is an object of the present invention to provide an improved form of attenuator which can easily be adapted for variable attenuation with few components.

SUMMARY OF THE INVENTION

The attenuator circuit of the invention includes first and second capacitors and first, second and third switches. The first switch is connected between the input terminal and the first capacitor the second switch is connected between the first capacitor and the second capacitor and the third switch is connected between the first capacitor and the output terminal of the attenuator. The circuitry arranges for closing of the second switch over a plurality of subsequent time intervals thereby to discharge each time through the second capacitor a portion of the voltage on the first capacitor such that the voltage on the first capacitor is reduced by a factor $C1/(C1+CD)$ to the power N where C1 is the capacitance of the first capacitor, CD the capacitance of the second capacitor and N is the number of subsequent time intervals. The circuitry also arranges for closing the third switch after a predetermined number of subsequent time intervals has elapsed whereby the attenuated voltage on the first capacitor is fed to the output terminal.

By making at least one of the first and second capacitors manually adjustable the ratio of C1 to (C1+CD) can be varied thereby changing the magnitude of each attenuation step.

According to the broadest aspect described above, the invention is not limited to operation as an automatic linear compressor. Operation as an automatic linear compressor is achieved by providing in combination with the circuitry previously mentioned circuitry for deriving an attenuator control signal. This includes a positive peak detector deriving from the input signal a time averaged signal corresponding to the average positive peak values of the input signal. This time averaged signal is continuously compared with a time increasing reference signal and a control signal is derived. The value or sign of the control signal is dependent on the comparison. The control signal is used to control closing of the second switch such that second switch is closed only while the control signal has a predetermined value or sign.

DESCRIPTION OF THE PREFERRED EMBODIMENT

Figure 1:
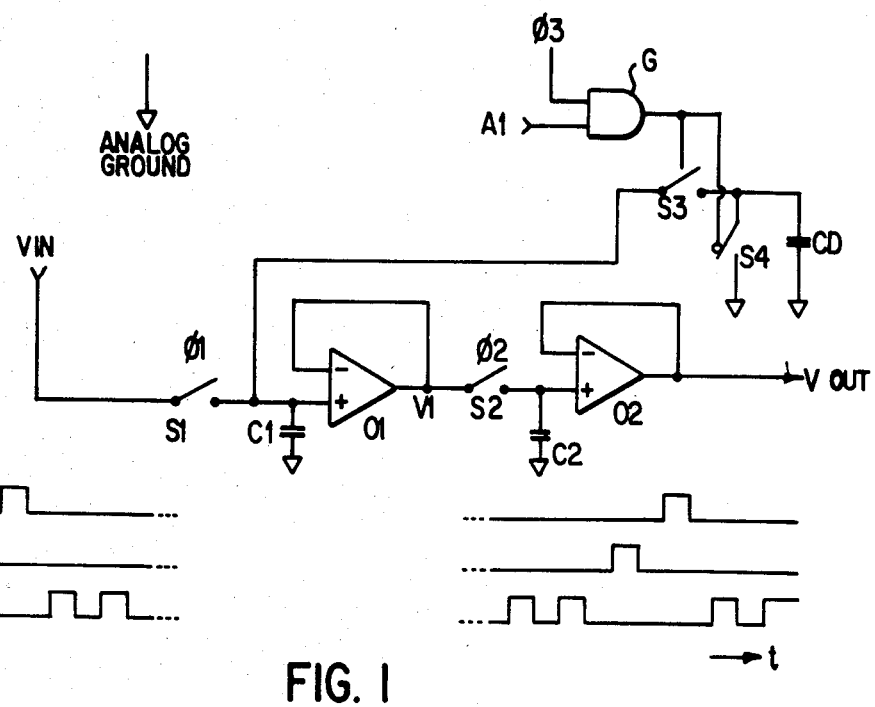
FIG. 1 is a schematic circuit diagram, partially in block form, of a variable attenuator according to the invention and showing the timing pulses used in the operation of the attenuator.
Figure 2:
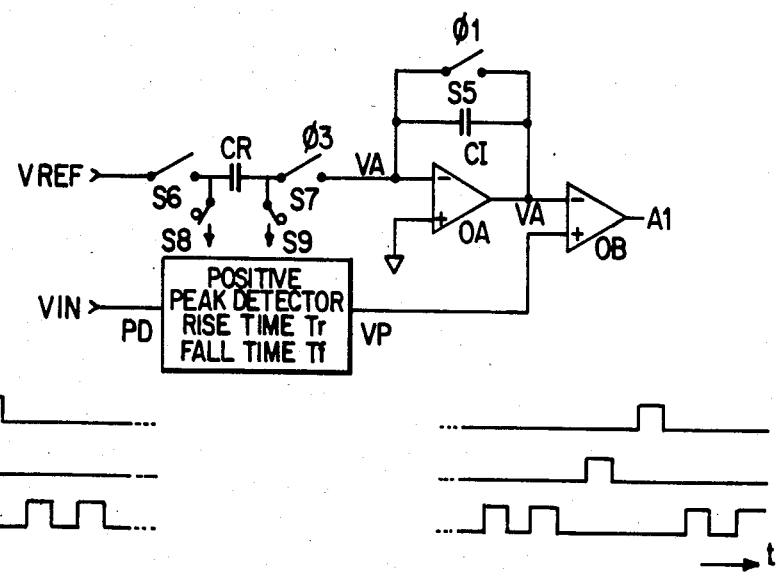
FIG. 2 is a schematic circuit diagram, partially in block form, of control circuitry used for controlling the variable attenuator of FIG. 1 according to a linear compression mode, this figure also showing the timing pulses used in the operation of the invention.

Both FIGS. 1 and 2 illustrate timing pulses $\phi 1$, $\phi 2$ and $\phi 3$ used in the operation of the circuits of FIGS. 1 and 2. These pulses may be generated at specific predetermined intervals by any appropriate pulse generating and logic circuitry which, because such circuitry is well known in the art, is not specifically shown. The timing pulses are used to close or open specific switches in the circuits of FIGS. 1 and 2 at specific times as will be described in greater detail below.

Referring now to FIG. 1, an input signal VIN, which is to be attenuated, is sampled onto a capacitor C1 when a switch S1 is closed by the application of a timing pulse $\phi 1$. Following the application of pulse $\phi 1$ switch S1 opens again and shortly thereafter the attenuation process commences. Specifically, an AND gate G has one input to which pulses $\phi 3$ are applied and another input to which a control signal A1 is applied. It can be seen that the first pulse $\phi 3$ is applied shortly after pulse $\phi 1$ ceases and, providing signal A1 is high when the first pulse $\phi 3$ is high, the output of gate G is high. This high output signal causes a switch S3 to close and a switch S4 to open. Closure of switch S3 causes some of the charge on capacitor C1 to be leaked to a capacitor CD through switch S3. Specifically, the charge is redistributed between capacitors C1 and CD to reduce the sample voltage on capacitor C1 by a factor equal to capacitance of C1 divided by the total capacitance of C1 plus CD, written in short hand form as $C1/(C1+CD)$.

When the first pulse $\phi 3$ goes low the output of gate G goes low, causing switch S3 to open and switch S4 to close, thereby discharging capacitor CD. When the next pulse $\phi 3$ is applied to gate G, switches S3 and S4 again reverse and the sample voltage remaining on capacitor C1 is again reduced by the factor $C1/(C1+CD)$. The charge redistribution and resultant gain attenuation may occur from 0 to N times, where N is the number of $\phi 3$ pulses occurring between the first $\phi 1$ pulse and the subsequent $\phi 2$ pulse referred to below, under the control of signal A1. If signal A1 is high during a number M of $\phi 3$ pulses between $\phi 1$ and $\phi 2$ then the input sample VIN which appeared initially on C1 is attenuated by $C1/(C1+CD)$ to the power M.

An operational amplifier O1 and normally open switch S2 connect capacitor C1 to a capacitor C2, amplifier O1 being connected as a buffer. After a predetermined number of $\phi 3$ pulses, a clock pulse $\phi 2$ is applied to switch S2 thereby closing switch S2 and applying the buffered attenuated voltage V1 on capacitor C1 to capacitor C2. An operational amplifier O2 is connected as a buffer to capacitor C2 and the buffered attenuated voltage of capacitor C2 becomes the output voltage VOUT.

Shortly after pulse $\phi2$ goes low to open switch S2 again, the next $\phi1$ pulse closes switch S1 again to introduce a new sample of VIN to capacitor C1, thereby re-initiating the sample attenuation cycle.

The magnitude of the attenuation steps can be adjusted by changing the ratio of C1 to C1+CD and this can best be effected by making capacitor CD manually adjustable.

The maximum number of attenuation steps can be altered by changing the number of $\phi3$ pulses between the input sample signal $\phi1$ and the output sample signal $\phi2$.

As described above, the attenuation cycles are effective only as long as attenuator control signal A1 is high. This signal can be generated in many different ways depending on the application, i.e., the use to which the attenuator of FIG. 1 is to be put. Where the attenuator is to be used as an automatic linear compression circuit, control signal A1 is generated in a circuit according to FIG. 2.

Figure 3:
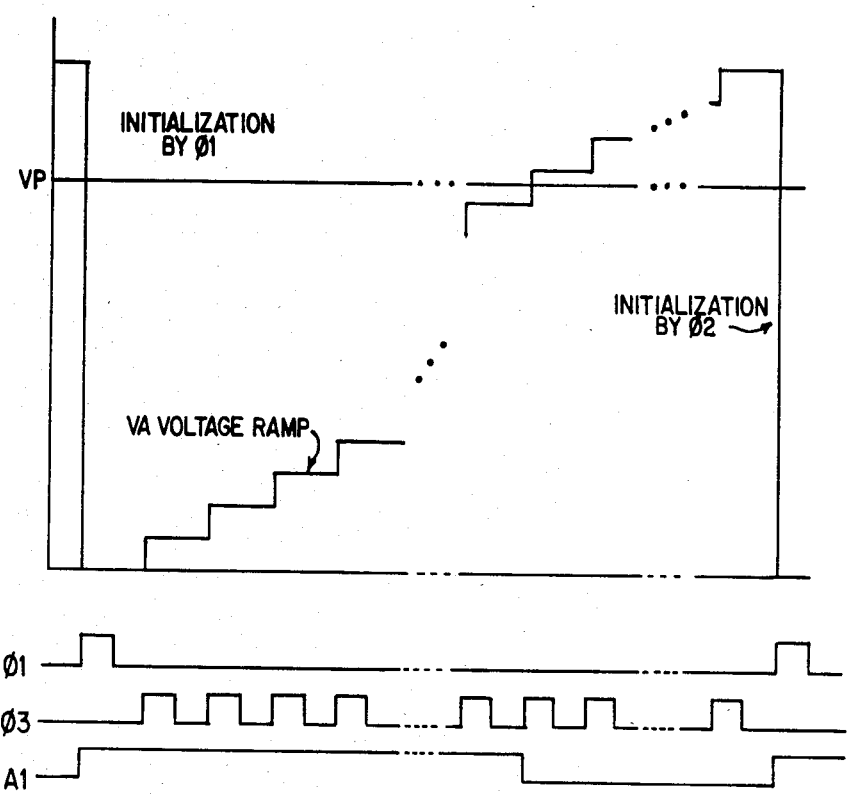
FIG. 3 is a timing diagram illustrating the operation of the circuit of FIG. 2.
Figure 4:
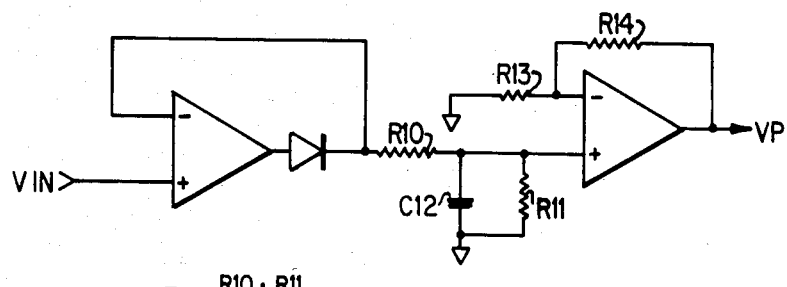
FIG. 4 is a schematic diagram of a typical positive peak detector which forms part of the circuit of FIG. 2.

With reference to FIGS. 2 and 3, VIN, which may be the voice signal or dial tone received at a telephone terminal, is applied to a positive peak detector PD which is a well known and readily available device which filters and averages over time the positive signal peaks of signal VIN to produce an average value VP having time constants Tr for rise time and Tf for fall time. The value of the time constant Tr is significant in discriminating between voice signals which have relatively few peaks and dial tones which are comprised almost entirely of peaks; specifically, the longer the rise time the fewer peaks of the voice signals which will be detected. The actual value of Tr is determined by trial and error. FIG. 4 illustrates a practical circuit for the peak detector in which the rise time $$Tr = \frac{R10 \cdot R11}{(R10 + R11)} \cdot C12 \text{ and } Tf = R11 \cdot C12.$$

Voltage VP is applied to the non-inverting input of a comparator OB. A voltage VA which is applied to the inverting input of comparator OB is derived from a d.c. reference voltage VREF as follows.

The voltage VREF is applied through a normally open switch S6 to one side of a capacitor CR the other side of which is connected through a normally open switch S7 to an operational amplifier OA connected as an integrator having an integrating capacitor CI connected thereacross. A normally open switch S5 is connected in parallel with capacitor CI and is arranged to close an application thereto of a pulse $\phi1$. At the output of integrator OA the voltage signal VA is derived.

In operation, when the first pulse $\phi1$ is applied to close switch S5 the voltage VA is reduced to an initial value of zero by the shorting of capacitor CI. As seen in FIG. 3, every time a pulse $\phi3$ is applied to close switches S6 and S7 the reference voltage VREF is applied through capacitor CR to integrator OA and every time a pulse $\phi3$ goes low capacitor CR is discharged through switches S8 and S9 which are normally closed switches connected to opposite sides of capacitor CR. As can be seen in FIG. 3 the voltage VA is a ramp voltage which is incremented by a value equal to VREF multiplied by the capacitance of capacitor CR divided by the capacitance of capacitor CI, or (CR/CI)×VREF. This ramped voltage VA is, as indicated above, compared with the filtered average positive peak level VP in comparator OB. The attenuator control signal A1 remains high until VA exceeds VP. Thus, the higher the value of VP the higher the number M of $\phi3$ pulses during which A1 will be high and so the higher the value C1/(C1+CD) to the power M by which VIN is attenuated by the attenuator of FIG. 1.

The rate of increase of attenuation with filtered peak level, i.e., the number of $\phi3$ pulses during which signal A1 is high, can be altered by changing the ramp voltage rate by altering the capacitor ratio CR to CI or by changing VREF.

It should be understood that switches S1 to S9 could theoretically be any kind of electronic or electromagnetic switch devices but, in practice, solid state logic switches using MOS technology have been found to be particularly useful in this application. Positive logic switches S1, S2, S3, S5, S6 and S7 are arranged to close, i.e. become conductive, when a logic 1 (High) pulse is applied and negative logic switches S4, S8 and S9 are arranged to open when a logic 1 pulse is applied. Such switches are well known in the art and are not, therefore, described in detail herein.

Typical examples of the values of components, voltages, frequencies and the like used in the circuitry of FIGS. 1 and 2 as implemented in an integrated circuit configuration are as follows.

VREF = 1 V
C1 = C2 = 7.94 pF
CD = 2.06 pF
CI = 12 pF
CR = 0.6 pF
Tr = 15 msec
Tf = 75 msec
N = 15
Period of $\phi1$ = 31.25 $\mu$sec
$\phi1$, $\phi2$, $\phi3$ Pulse Width = 15 $\mu$sec.

For this implementation each attenuation cycle reduces the input signal by the factor $$\frac{C1}{C1 + CD} = 0.794 = -2dB$$

The attenuation range is from 0 to 30 dB in 2 dB steps.
The voltage ramps from the analog reference ground in increments of 0.6/12 = 50 mV in 15 steps to 750 mV.
Thus the attenuation characteristic produced is given by the following table:

| VP | ATTENUATION |
|---|---|
| <50 mV | 0 |
| >50 mV; ≦100 mV | 2 |
| >100 mV; ≦150 mV | 4 |
| >150 mV; ≦200 mV | 6 |
| . | |
| . | |
| >700 mV; ≦750 mV | 28 |
| >750 mV | 30 |

What I claim as my invention is:

1. An attenuator circuit comprising an input terminal, for an input signal which is to be attenuated, an output terminal at which the attenuated signal is to be output, first and second capacitors, first, second and third switches, the first switch being connected between the input terminal and the first capacitor, the second switch being connected between the first capacitor and the second capacitor and the third switch being connected between the first capacitor and the output terminal, means for closing the first switch over a first time interval to sample the input signal on to the first capacitor, means for closing the second switch over a plurality of subsequent time intervals thereby to discharge each time through the second capacitor a portion of the voltage on the first capacitor such that the voltage on the first capacitor is reduced by a factor $C1/(C1+CD)$ to the power N where C1 is the capacitance of the first capacitor, CD the capacitance of the second capacitor and N is the number of subsequent time intervals, and means for closing the third switch after a predetermined number of subsequent time intervals has elapsed whereby the attenuated voltage on the first capacitor is fed to the output terminal.

2. An attenuator circuit as claimed in claim 1 including a first operational amplifier connected as a buffer between the first capacitor and the third switch, and a third capacitor and second operational amplifier acting as a buffer connected between the third switch and the output terminal.

3. An attenuator circuit as claimed in claim 2 in which the second switch includes a normally open contact between the first and second capacitors and a normally closed contact between the second capacitor and ground.

4. An attenuator circuit as claimed in claim 1, 2 or 3 including means generating clock pulses and wherein the means for closing the first, second and third switches comprise means for applying the clock pulses at predetermined times.

5. An attenuator circuit as claimed in claim 1, 2 or 3 including a control terminal for application of a control signal, the means for closing the second switch being operative to close the second switch only while the control signal appearing on the control terminal has a predetermined value or sign.

6. An attenuator circuit as claimed in claim 1, 2 or 3 including means generating clock pulses and wherein the means for closing the first, second and third switches comprise means for applying the clock pulses at predetermined times and further including a control terminal for application of a control signal, the means for closing the second switch being operative to close the second switch only while the control signal appearing on the control terminal has a predetermined value or sign.

7. An attenuator circuit as claimed in claim 1, 2 or 3 including means generating clock pulses and wherein the means for closing the first, second and third switches comprise means for applying the clock pulses at predetermined times, the means for applying clock pulses to close the second switch comprising an AND gate having a first input to which clock pulses are fed and a second input ulses to close the second switch comprising an AND gate having a first input to which clock pulses are fed and a second input ulses to close the second switch comprising an AND gate having a first input to which clock pulses are fed and a second input to which a control signal is fed whereby the second switch is closed only while the control signal has a predetermined sign.

8. An attenuator as claimed in claim 1, 2 or 3, in which at least one of the first and second capacitors is manually adjustable.

9. An attenuator circuit as claimed in claim 1 further comprising circuitry for deriving an attenuator control signal, comprising a positive peak detector deriving from the input signal a time averaged signal corresponding to the average positive peak values of the input signal, means comparing this signal continuously with a time increasing reference signal and deriving a control signal the value or sign of which is dependent on the comparison, means for applying the control signal to the means for closing the second switch such that second switch is closed only while the control signal has a predetermined value or sign.

10. An attenuator as claimed in claim 9 in which the means comparing is an operational amplifier which derives a control signal of one sign when the time averaged signal is above the reference signal and a control signal of an opposite sign when the time averaged signal is below the reference signal.

11. An attenuator as claimed in claim 10 including means generating clock pulses and wherein the means for closing the first, second and third switches comprises means for applying the clock pulses at predetermined times, the means for applying clock pulses to close the second switch comprising an AND gate having a first input to which clock pulses are fed and a second input to which the control signal is fed whereby the second switch is closed only while the control signal has the one sign.

12. An attenuator as claimed in claim 11 in which the time increasing reference voltage is derived as a ramp voltage using an integrator circuit.

13. An attenuator as claimed in claim 12 in which the integrator circuit includes a fourth capacitor connected to a reference voltage source, an integrating amplifier including a fifth capacitor connected thereacross, a fourth switch connected in parallel with the fifth capacitor and a fifth switch connecting the reference voltage source to the integrating amplifier, means for closing the fourth switch over the first time interval thereby initializing the ramp voltage to zero and means for closing the fifth switch over the plurality of subsequent time intervals thereby to increment the ramp voltage by a factor dependent on the ratio of values of the fourth and fifth capacitors.

14. An attenuator as claimed in claim 13 in which at least one of the fourth and fifth capacitors is manually adjustable to vary the ratio.

15. An attenuator as claimed in claim 9, 10 or 11 in which the positive peak detector has a rise time which is sufficiently long to cause at least some voice signal peaks to be disregarded.

* * * * *